(12) United States Patent
Heike et al.

(10) Patent No.: US 7,557,662 B2
(45) Date of Patent: Jul. 7, 2009

(54) OSCILLATOR AND FREQUENCY DETECTOR

(75) Inventors: Seiji Heike, Kawagoe (JP); Tomihiro Hashizume, Hatoyama (JP)

(73) Assignee: Hitachi, Ltd., Tokyo (JP)

( * ) Notice: Subject to any disclaimer, the term of this patent is extended or adjusted under 35 U.S.C. 154(b) by 126 days.

(21) Appl. No.: 11/905,815

(22) Filed: Oct. 4, 2007

(65) Prior Publication Data

US 2008/0084248 A1    Apr. 10, 2008

(30) Foreign Application Priority Data

Oct. 10, 2006    (JP)    ............................. 2006-275941

(51) Int. Cl.
*H03L 7/00*    (2006.01)
(52) U.S. Cl. ................................ 331/2; 331/18; 331/48
(58) Field of Classification Search ..................... 331/2, 331/18, 48
See application file for complete search history.

(56) References Cited

U.S. PATENT DOCUMENTS

| 2,478,973 | A | * | 8/1949 | Mahren | ........................ | 331/38 |
| 2,781,450 | A | * | 2/1957 | Ianouchewsky | .............. | 331/38 |
| 2005/0116781 | A1 | * | 6/2005 | Yamamoto et al. | ............. | 331/2 |
| 2007/0040615 | A1 | * | 2/2007 | Ammar | .......................... | 331/2 |

* cited by examiner

*Primary Examiner*—Joseph Chang
(74) *Attorney, Agent, or Firm*—Reed Smith LLP; Juan Carlos A. Marquez, Esq.

(57) ABSTRACT

In an oscillating apparatus or a frequency detecting apparatus in which a center frequency and a variable frequency range are freely or optionally established with a high stability and a high accuracy, a first frequency component of a signal from a first crystal oscillator and a second frequency component of another signal from a second crystal oscillator are subjected to a synthesizing operation in a synthesizer and to other operations to obtain a desired center frequency and a desired variable frequency range.

7 Claims, 6 Drawing Sheets

OSCILLATOR AND FREQUENCY DETECTOR

CLAIM OF PRIORITY

The present application claims priority from Japanese applications JP-2006-275941 filed on Oct. 10, 2006 the content of which is hereby incorporated by reference into this application.

BACKGROUND OF THE INVENTION

The present invention relates to oscillating apparatus and frequency detecting apparatus, and particularly to voltage controlled oscillating apparatus the frequency of which is variable with an external voltage.

In the conventional voltage controlled oscillators having a basic oscillating circuit using a resistor and a capacitor, or using an inductor and a capacitor, the capacitor is usually implemented with a variable capacitance diode or the like so that the capacitance of the capacitor component of the oscillating circuit is varied with an external voltage, whereby the oscillation frequency determined by a combination of the resistance of the resistor or of the inductance of the inductor and the capacitance of the capacitor is varied.

Further, voltage controlled oscillators have been developed in which an oscillating circuit using a crystal oscillator element or ceramic oscillator element also makes use of a variable capacitance diode so that the overall characteristics are variable to make it possible to control the oscillation frequency more precisely.

Additionally, in recent years, as frequency controlled oscillating apparatus, direct digital synthesizers have also been developed, the frequency of an output of which is numerically controllable. In this apparatus, output waveform data are prepared and stored in a memory in advance, a predetermined constant value is cumulatively added in a cumulative adder in synchronism with an input signal to the apparatus and a data stored at an address determined by a cumulation value is delivered to thereby supplying an output of a frequency different from that of the input signal.

SUMMARY OF THE INVENTION

With voltage controlled oscillators using a resistor, a capacitor, an inductor and the like, it will be possible to freely establish a center frequency of oscillation and a range of frequency variation or a variable frequency range by selecting the value of the respective elements. However, since the temperature coefficients of the respective elements have significant influences on the oscillation frequency, the stability of the oscillation frequency against the temperature will, at most, be around 100 ppm/° C., and the frequency accuracy will be as low as several %.

Meanwhile, voltage controlled oscillators using a ceramic oscillator element or a crystal oscillator element have a very high stability of the oscillation frequency against the temperature, because temperature coefficient of the respective elements is as low as 30 ppm/° C. or 10 ppm/° C. and frequency accuracy of the respective elements is as high as 0.5% or 0.001%.

However, in the above-mentioned voltage controlled oscillators, since the each oscillator element has a fixed oscillation frequency determined by its shape, it is impossible to vary the center frequency of oscillation of the oscillators.

Particularly, in the voltage controlled crystal oscillator, since the crystal oscillator element has an extremely high Q factor, a range of frequency variation is, at most, around 1%.

As for the voltage controlled ceramic oscillator, it has a range of frequency variation in the order of 10%. Thus, it has heretofore been impossible to realize a voltage controlled oscillator having an oscillation frequency stability against the temperature and a frequency accuracy as high as those of a crystal oscillator element or of a ceramic oscillator element and having a center frequency and a variable frequency range which can be freely established.

In a direct digital synthesizer, since its output signal is completely synchronous with its input signal, use of an oscillation signal from a crystal oscillator element as the input signal will provide an oscillation frequency stability against the temperature and a frequency accuracy as high as those of a crystal oscillator element. However, the unit of variation in which the oscillation frequency is variable is determined by the frequency of the input signal and the number of bits of the cumulative adder, and therefore, realization of a fine variation of the frequency will require an extremely high frequency input signal or, otherwise, a cumulative adder having a large number of bits, which will be impractical.

The present invention has been made based on the perception such that a signal of a new oscillation frequency synthesized by use of oscillation signals of a high stability and a high accuracy from crystal oscillator elements or from ceramic oscillator elements does not undergo degradation of the frequency stability and accuracy to a large extent.

That is, a variable frequency range is established in such a manner that the frequency of an output from a voltage controlled oscillator using a crystal oscillator element or a ceramic oscillator element is changed to a times as large as that of the output of the oscillator element by means of a frequency varying unit operative in synchronism with the oscillator to provide a first signal, where a is a constant. Meanwhile, variation of the center frequency is accomplished in such a manner that a second signal is added to the first signal to make use of an absolute value of a sum of or a difference between the frequencies of the first and second signals, the second signal being provided, similarly to the first signal, by changing the frequency of an output from another voltage controlled oscillator using another crystal oscillator element or another ceramic oscillator element to b times as large as that of the output of the another oscillator element by means of another frequency varying unit operative in synchronism with the another oscillator, where b is a constant.

By properly selecting constants for the respective frequency varying units, it is possible to obtain any desired center frequency and any desired variable frequency range. It is understood that as far as the constants for the frequency varying units fall in an appropriate range of values, the frequency stability and accuracy will be as good as those of the crystal oscillator elements or of the ceramic oscillator elements.

According to an aspect of the present invention, a voltage controlled oscillator having a frequency stability against temperature and a frequency accuracy as high as those of crystal oscillator elements or ceramic oscillator elements is provided in which the center frequency and the variable frequency range can be freely established.

Other objects, features and advantages of the invention will become apparent from the following description of the embodiments of the invention taken in conjunction with accompanying drawings.

DESCRIPTION OF THE EMBODIMENTS

The present invention makes it possible for an oscillating apparatus having a voltage controlled crystal oscillator or a voltage controlled ceramic oscillator to freely establish a center frequency of oscillation and/or a variable frequency range, without sacrificing the oscillation frequency stability against temperature and the oscillation frequency accuracy.

Embodiment 1

Figure 1:
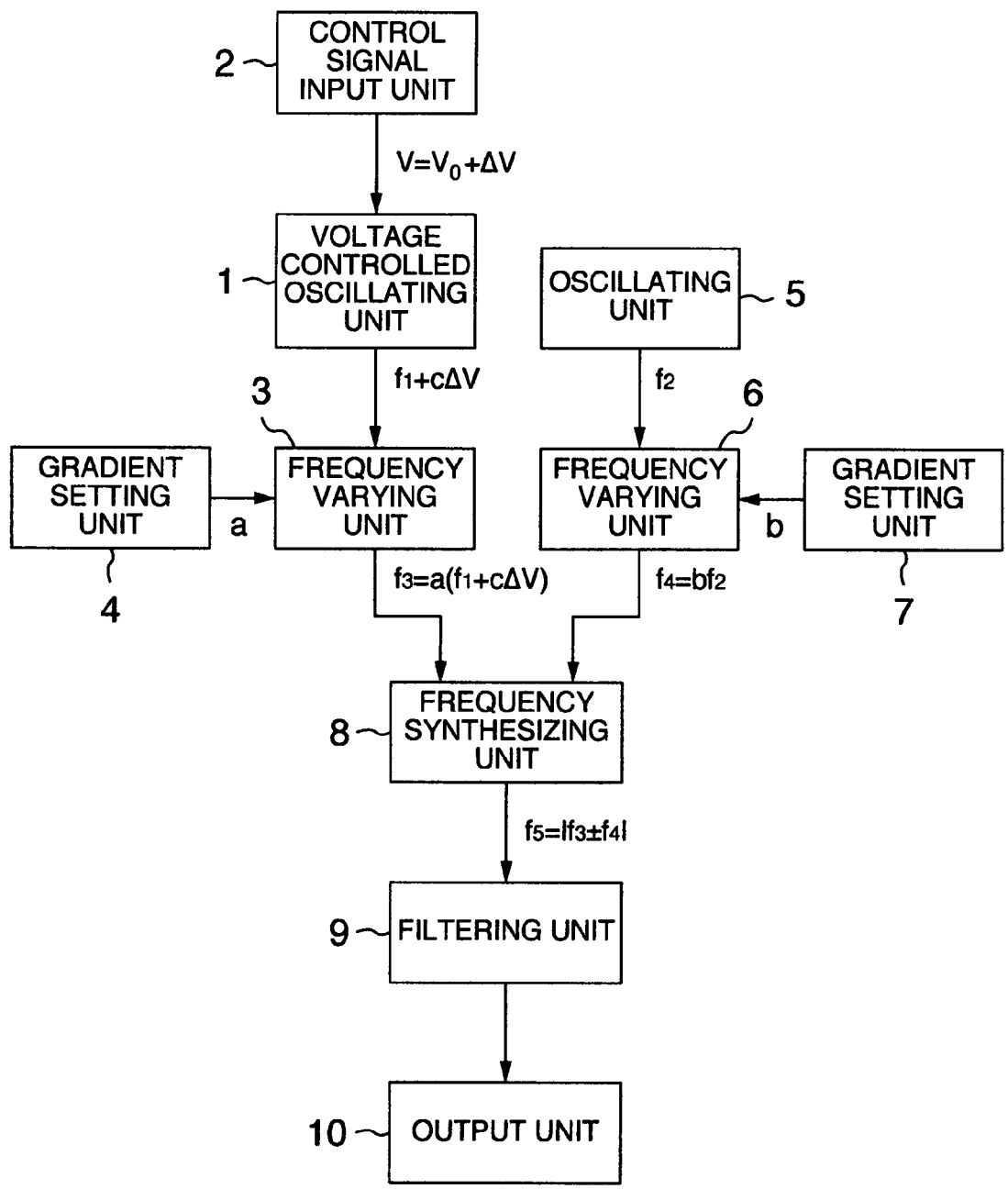
FIG. 1 is a block diagram of an oscillating apparatus according to Embodiment 1 of the present invention.

An oscillating apparatus having an oscillation frequency which can be controlled with an external signal according to Embodiment 1 of the present invention will be described. FIG. 1 is a block diagram showing an example of a structure of the oscillating apparatus.

A principle of operation of the oscillating apparatus will first be described with reference to FIG. 1. A voltage controlled oscillating unit 1 oscillates at a frequency according to a voltage V applied thereto from a control signal input unit 2 to supply an oscillation signal. With the voltage V ($V=V_0+\Delta V$) changing by $\Delta V$ with respect to a center value $V_0$, the oscillation signal of the voltage controlled oscillating unit 1 will change, with respect to a center frequency $f_1$, with a coefficient c for the voltage change $\Delta V$, so that the frequency of the signal from the unit 1 is represented by: $f_1+c\cdot\Delta V$.

A frequency varying unit 3 varies the frequency of the oscillation signal supplied from the voltage controlled oscillating unit 1 at a rate a fed from a gradient setting unit 4, thereby delivering a signal of a frequency $f_3=a(f_1+c\cdot\Delta V)$.

Meanwhile, an oscillating unit 5 supplies an oscillation signal of a constant frequency $f_2$ to a frequency varying unit 6, which varies the frequency of the oscillation signal supplied from the oscillating unit 5 at a rate b fed from a gradient setting unit 7, thereby delivering a signal of a frequency $f_4=b\cdot f_2$.

A frequency synthesizing unit 8 synthesizes the output signals of the frequency varying units 3 and 6 to generate a signal including frequency components $f_5=|f_3\pm f_4|$ which are absolute values of a sum of and a difference between the frequencies of the output signals of the units 3 and 6. The comparative values for the frequencies $f_3$ and $f_4$ should be such that, for all of the values that the voltage V may assume, a relation $f_3 \geq f_4$ or a relation $f_3 \leq f_4$ should always stand. Namely, during variations of the frequency $f_3$ caused by variations of the voltage V, the comparative relation between the frequencies $f_3$ and $f_4$ should rest unchanged.

The signal from the frequency synthesizing unit 8 includes frequency components $f_3$ and $f_4$ which come from the outputs of the frequency varying units 3 and 6, respectively. These frequency components are removed by a filtering unit 9 so that a signal of only a frequency component $f_5$, which is a sum of or a difference between the frequencies $f_3$ and $f_4$, is extracted and delivered through an output unit 10.

The ultimate output frequency $f_5$ will be:

$$f_5=(a\cdot f_1 \pm b\cdot f_2)+a\cdot c\cdot\Delta V, \text{ when } f_3 \geq f_4$$

for all of the values that the voltage V may assume; and $$f_5=(b\cdot f_2 \pm a\cdot f_1)-a\cdot c\cdot\Delta V, \text{ when } f_3 \leq f_4$$

for all of the values that the voltage V may assume.

Thus, the sense of the coefficient of variations in the frequency $f_5$ in response to variations $\Delta V$ in the case of $f_3 \geq f_4$ is opposite to that in the case of $f_3 \leq f_4$.

Namely, assuming that the coefficient c of variations in the frequency $f_5$ in response to variations $\Delta V$ in the oscillation signal from the voltage controlled oscillating unit 1 is positive, the frequency $f_5$ will be increased with coefficient ($a\cdot c$) for $f_3 \geq f_4$, and will be decreased with coefficient ($-a\cdot c$) for $f_3 \leq f_4$.

The variable frequency range and the center frequency are established in accordance with the following procedures. Since the variable frequency range is determined by term ($a\cdot c\cdot\Delta V$), a value for the rate a is first determined at the gradient setting unit 4 to give a desired variable frequency range. Then, with the determined value for a, a value for the rate b is determined in the gradient setting unit 7 so that the center frequency to be given by term ($a\cdot f_1 \pm b\cdot f_2$) (for $f_3 \geq f_4$) or by term ($b\cdot f_2 \pm a\cdot f_1$) (for $f_3 \leq f_4$) will take a desired value.

The voltage controlled oscillating unit 1 may be constituted by a voltage controlled oscillator (VCO), a voltage controlled crystal oscillator (VCXO), a voltage controlled ceramic oscillator, a voltage-frequency converter, or any other device that produces a voltage signal having a frequency variable in response to an input voltage signal. Particularly, use of a VCXO will provide good results.

The control signal input unit 2 may be constituted by a device which includes a constant-voltage power source and a variable resistor connected thereto for diving a voltage of the power source for external supply, when the unit 2 is of the type manually operable, or may be constituted by a device which includes a DA converter for converting a digital signal from a computer or the like to an analog voltage signal for external supply, when the unit 2 is of the type for a digital control.

The oscillating unit 5 may be constituted by any oscillator, and it is preferable that the oscillator should have a frequency stability as good as or better than that of the voltage controlled oscillating unit 1. Use of a crystal oscillator will provide good results.

The frequency varying units 3 and 6 may be, principally, implemented with a cumulative adder, a direct digital synthesizer (DDS), a frequency divider, a phase-locked loop (PLL) waveform generator, or any other device that generates an oscillation signal having a frequency variable in response to the frequency of an input signal thereto.

When use is made of a DDS or a cumulative adder, the output frequencies will be in a range of frequencies which are not higher than the frequency of an input signal, and the unit of variation in which the oscillation frequency is variable will be determined by the input signal frequency and the number of bits of the cumulative adder, i.e., it will be (input signal frequency $\div 2^N$), where N represents the number of bits of the cumulative adder. In this case, the gradient setting units 4 and 7 function to add, in the form of an N-bit digital signal, a numerical value A for each clock to the cumulative adders in the frequency varying units 3 and 6, respectively. The rate a of the frequency variation will be, for example, given by: $a=A/2^N$.

Specifically, the gradient setting units 4 and 7 may have a circuit structure in which a digital signal from a computer is held in a latch circuit and an output of the latch circuit is supplied to a cumulative adder, or may have a circuit structure in which an on-off operation such as in a DIP switch is utilized to generate a digital signal. When a frequency divider is used to implement the frequency varying units 3 and 6, the output frequencies will be in a range of frequencies which are not higher than the frequency of an input signal, and assuming that the frequency divider has N stages, it will be possible to establish the output frequency as (the input frequency/$2^n$), where n represents an integer not smaller than 1 and not larger than N).

An ultimate output signal from the unit 3 or 6 is delivered though a multiplexer serving to select one of the output signals which may be derived from the respective stages of the frequency divider. In that case, the gradient setting units 4 or 7 serves to apply to the multiplexer a numerical value n in the form of a digital signal which designates one of the output signals of the stages of the frequency divider to be selected. The rate a, for example, will be given by: $a=1/2^n$. Practical circuit structures similar to a DDS may be used.

When a PLL waveform generator is used to implement the frequency varying units 3 and 6, the output frequencies will be in a range of frequencies which are not lower than the frequency of an input signal, and assuming that the PLL includes an N-stage frequency divider, it will be possible to establish the output frequency as $2^n$ times the input frequency, where n represents an integer not smaller than 1 and not larger than N. In this case, the gradient setting units 4 and 7 may have a structure similar to that when each of the units 3 and 6 are implemented with a frequency divider. In either case, when the input signal is in a sinusoidal waveform, it may be converted to a rectangular waveform signal, if necessary.

The frequency synthesizing unit 8 may be implemented with a multiplier circuit, when the input signal thereto is in a sinusoidal waveform, and may be implemented with an EXOR circuit, an OR circuit, an AND circuit or any other circuit receiving two input signals and capable of producing, as a result of a logical operation, an output signal including a frequency component of a sum of or a difference between the frequencies of the two input signals, when the input signal to the unit 8 is in a rectangular waveform. When the input signal to the unit 8 is rectangular, use of an EXOR circuit for the unit 8 will provide good results. When the input signal is in a sinusoidal waveform, it may be converted to a rectangular waveform signal, if necessary.

The output signal from the frequency synthesizing unit 8 contains, in addition to the frequency components of a sum of and a difference between the two input signals thereto, the frequency components of the two input signals themselves. A filtering unit 9 is used in order to remove those frequency components which are other than the frequency components of a sum of and a difference between the two input signals. The unit 9 may be implemented with a band-pass filter having a passband of desired frequencies. A high-pass filter may also be used to implement the unit 9 when the output signal of the desired frequencies is a sum of the two input signals, while a low-pass filter may also be used to implement the unit 9 when the output signal of the desired frequencies is a difference between the two input signals and the desired frequencies are lower than the frequency of any one of the two input signals.

The output unit 10 may be implemented with a voltage follower which serves to lower the output impedance. Such voltage follower is dispensable.

Figure 2:
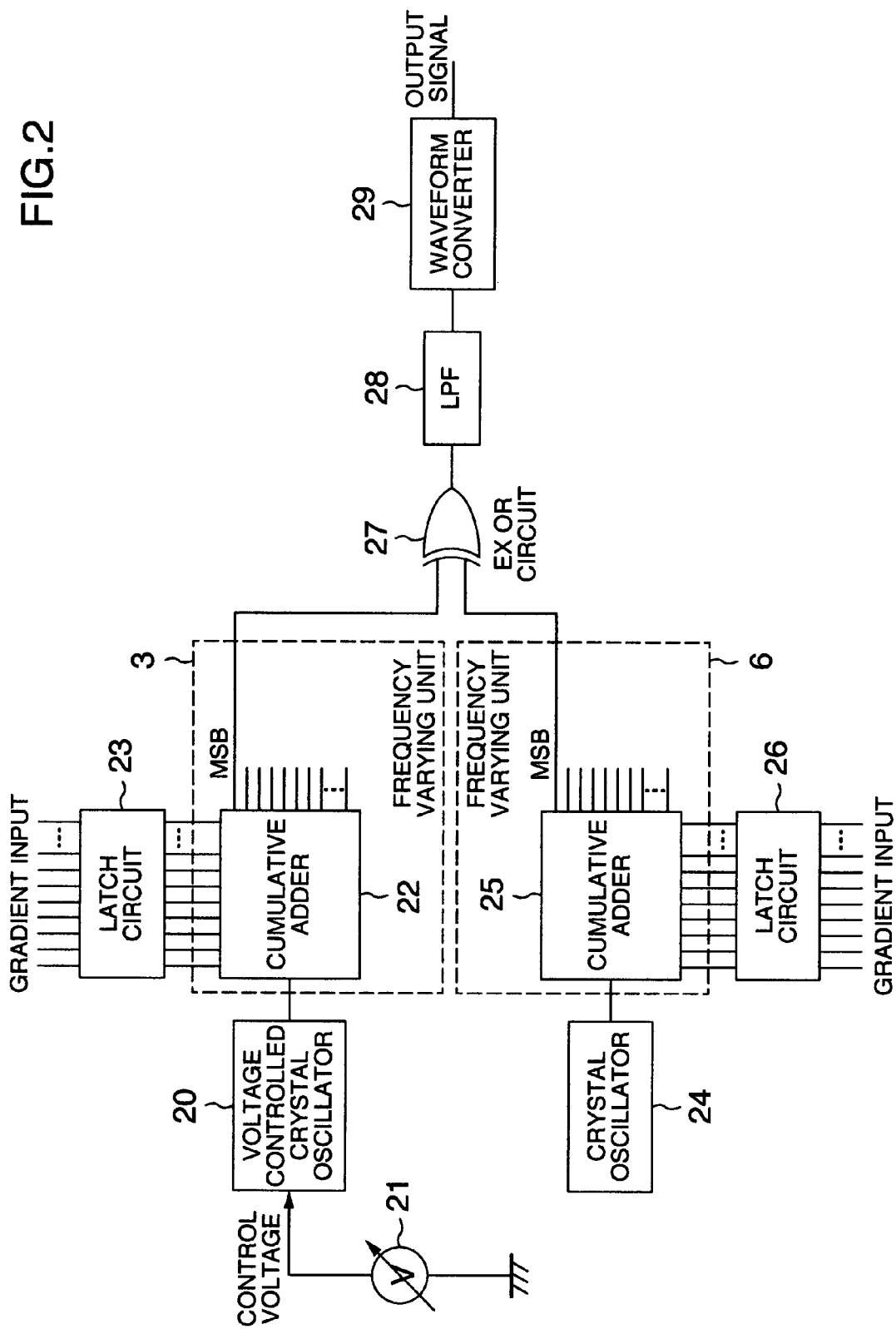
FIG. 2 is a first circuit diagram of an oscillating apparatus according to Embodiment 1 of the present invention.

FIG. 2 is a circuit diagram of an oscillating apparatus in which each of the frequency varying units 3 and 6 is implemented with a cumulative adder. A voltage controlled crystal oscillator 20 having a center frequency of 67.108864 MHz is used to constitute the voltage controlled oscillating unit 1 (FIG. 1). A variable voltage source 21 generates a control voltage signal which is variable through ±2 V from a center voltage of 2.5 V. The output signal of the voltage controlled oscillator 20 has its frequency varied through ±6710.8864 Hz from its center frequency of 67.108864 MHz in response to the variations of the control voltage signal from the variable voltage source 21. The frequency varying unit 3 is implemented with a 26 bit cumulative adder 22.

The cumulative adder 22 cumulatively adds a value, set in advance, for each period of the signal from the voltage controlled crystal oscillator 20 and delivers an output signal in the form of a 26 bit numerical value. When the numerical value in the cumulative adder 22 exceeds a number 67108863, the largest of those that can be represented by the 26 bit number, since a carry from the most significant bit (MSB) is neglected, the numerical value represented by the adder 22 will be a true numerical value minus 67108864. The value of the MSB will be 0 when the numerical value in the cumulative adder 22 is 0 to 33554431, and will be 1 when the numerical value in the cumulative adder 22 is 33554432 to 67108863, so that the MSB terminal will generate one period of a rectangular wave while the cumulative adder 22 performs one cycle of operation.

Assuming that a numerical value to be cumulatively added at the cumulative adder 22 is f, the cumulative adder 22 will have to perform addition 67108864/f times to complete one cycle of operation, in which the MSB terminal will generates a signal of a frequency of f (Hz), i.e., f/67108864 times the frequency of the signal from the voltage controlled crystal oscillator 20.

By setting, as the numerical value to be cumulatively added, a number in Hz representing a desired output frequency, the desired frequency can be set for an output signal from the MSB terminal of the cumulative adder 22. For example, if an output of 100 KHz is desired, a numerical value of 100000 should be set. The numerical value to be set and cumulatively added may be given, for example, from a personal computer in the form of a 26 bit digital signal and is held in a latch circuit 23 so that the circuit 23 supplies the 26 bit digital signal to the cumulative adder 22.

Meanwhile, the oscillating unit 5 (FIG. 1) is constituted by a crystal oscillator 24 having an oscillation frequency of 67.108864 MHz. The frequency varying unit 6 is, like the frequency varying unit 3, implemented with a 26 bit cumulative adder 25 so that a latch circuit 26 is used to set a frequency. The outputs from the frequency varying units 3 and 6 are inputted to an exclusive OR circuit 27 so that the circuit generates a compression wave signal having a frequency of a difference between the two inputted signals. A low-pass filter 28 removes the original frequency components of the two inputted signals to thereby produce a sinusoidal wave signal having a frequency of a difference between the two inputted signals. Further, the sinusoidal wave signal is fed to a waveform converter 29 and converted to an eventual digital signal of a rectangular waveform.

In this embodiment, the low-pass filter 28 is constituted by a third order low-pass filter having a cutoff frequency of 150 KHz and the waveform converter 29 is constituted by an amplifier. In the described oscillating apparatus, by setting a numerical value of 1000000 for the cumulative adder 22 of the frequency varying unit 3 so that the unit 3 generates an output signal of a frequency of 1 MHz ±100 Hz, and a numerical value of 900000 for the cumulative adder 25 of the frequency varying unit 6 so that the unit 6 generates an output signal of a frequency of 900 KHz, the apparatus provides an output signal of a frequency of 100 KHz±100 Hz which is a difference between the two output signals from the units 3 and 6. Meanwhile, in the described oscillating apparatus, by setting a numerical value of 10000000 for the cumulative adder 22 so that the unit 3 generates an output signal having a center frequency of 10 MHz and a variable frequency range of ±1000 Hz, and a numerical value of 9900000 for the cumulative adder 25 so that the unit 6 generates an output signal of a frequency of 9.9 MHz, the apparatus provides an output signal having a center frequency of 100 KHz and a variable frequency range of ±1000 Hz, which is a difference between the two output signals from the units 3 and 6.

The frequency varying units 3 and 6 may be implemented with, other than a cumulative adder, a frequency divider or a PLL.

Figure 3:
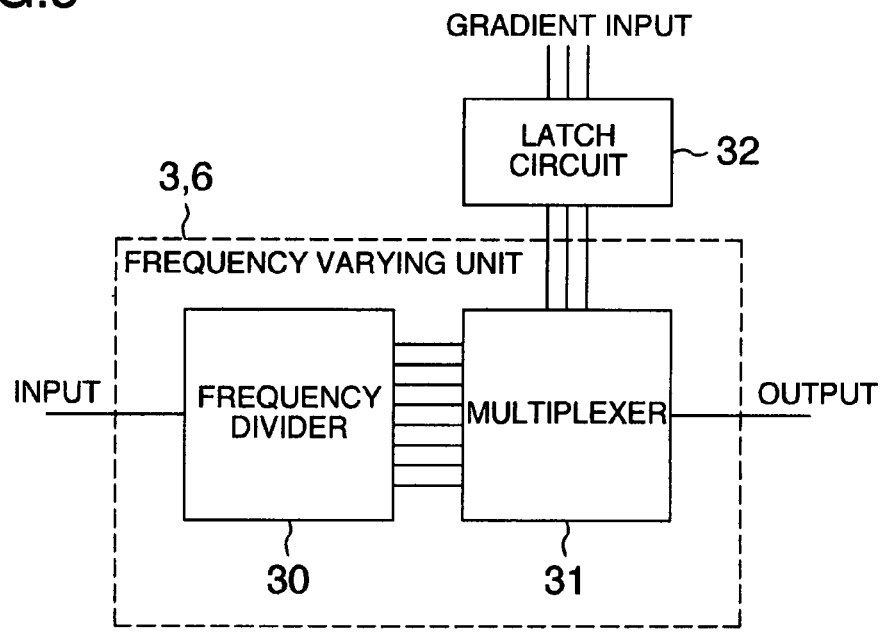
FIG. 3 is a circuit diagram of a first frequency varying unit and a first gradient setting unit according to Embodiment 1 of the present invention.

FIG. 3 is a circuit diagram of a first frequency varying unit and a first gradient setting unit in which each of the frequency varying units 3 and 6 are implemented with a frequency divider. The unit 3 (or 6) includes, in addition to a frequency divider 30, a multiplexer 31. The frequency divider 30 is a 8 stage counter which is arranged to receive an output signal from the voltage controlled crystal oscillator 20 (or 24) and to deliver, from the respective stages, eight output signals having frequencies equal to ½, ¼, ⅛, 1/16, 1/32, 1/64, 1/128 and 1/256 of the received signal, respectively. These eight output signals are fed to the multiplexer 31 having eight input terminals so that one of them is selected as an output of the unit 3 (or 6).

The selection of one of the eight output signals of the frequency divider 30 is accomplished by designating, by use of three bit address lines, one of the eight addresses 0 to 7 corresponding to the eight input terminals of the multiplexer 31. In this embodiment, a 3 bit address signal is generated by a personal computer and is held in a latch circuit 32 so that an address signal is applied therefrom to the multiplexer 31.

A substitution of the structure shown in FIG. 3 for the frequency varying units 6 of the oscillating apparatus shown in FIG. 2 provides the following results.

When the multiplexer 31 selects the frequency division signal at the eighth stage, i.e., a signal of 262.144 KHz and a numerical value 362144 is set for the cumulative adder 22 of the frequency varying unit 3 so that the output signal of the unit 3 has a center frequency of 362.144 KHz and a variable frequency range of ±36.2144 Hz, the oscillating apparatus provides an output signal having a center frequency of 100 KHz and a variable frequency range of ±36.2144 Hz, which is a difference between the two output signals from the units 3 and 6.

Meanwhile, when the multiplexer 31 selects the frequency division signal at the sixth stage, i.e., a signal of 1048.576 KHz and a numerical value 1098576 is set for the cumulative adder 22 of the frequency varying unit 3 so that the output signal of the unit 3 has a frequency of 1098.576 KHz ±109.8576 Hz, the oscillating apparatus provides an output signal having a center frequency of 50 KHz and a variable frequency range of ±109.8576 Hz, which is a difference between the two output signals from the units 3 and 6.

Figure 4:
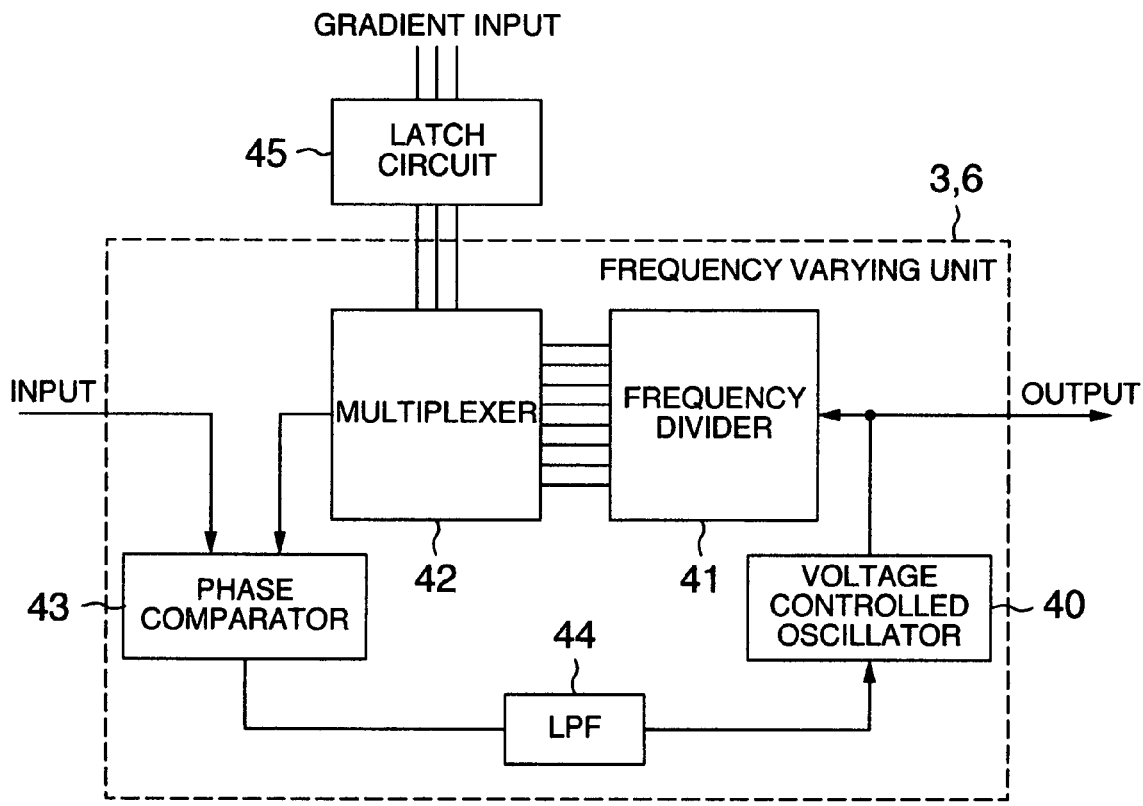
FIG. 4 is a circuit diagram of a second frequency varying unit and a second gradient setting unit according to Embodiment 1 of the present invention.
Figure 5:
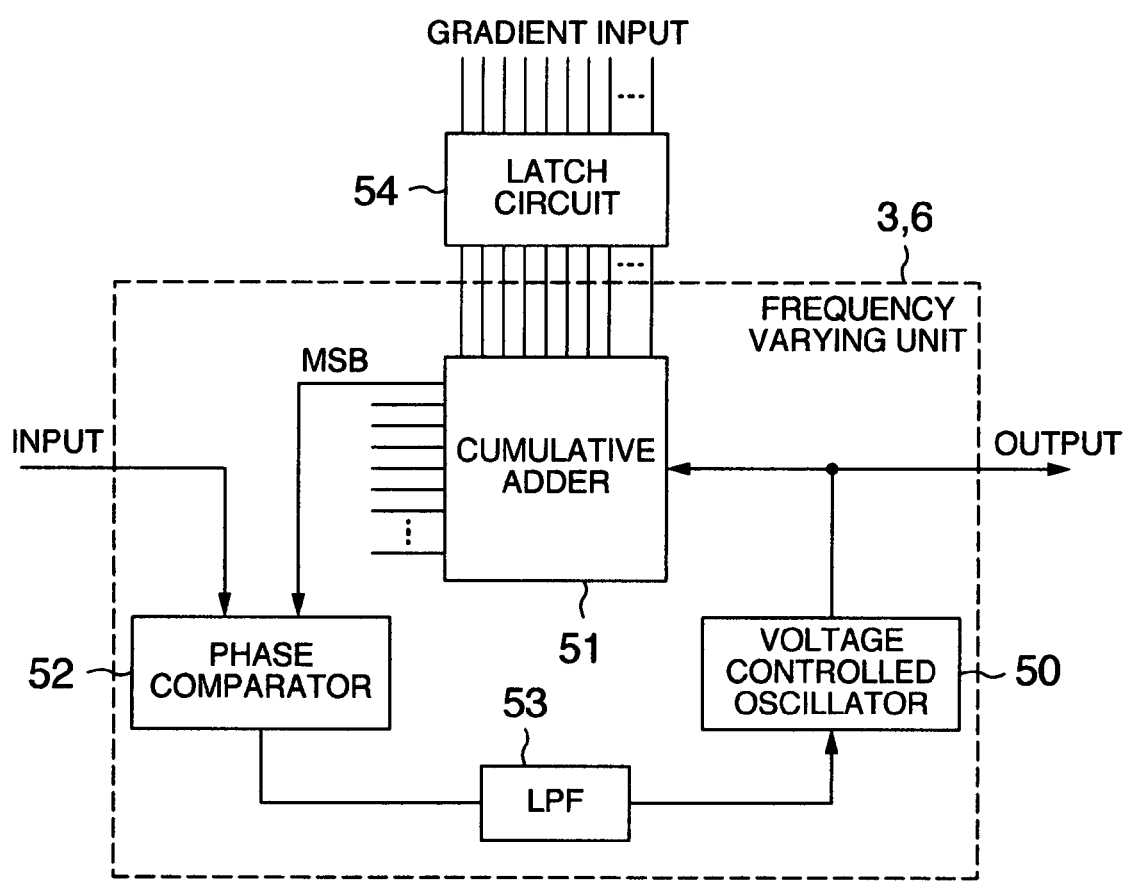
FIG. 5 is a circuit diagram of a third frequency varying unit and a third gradient setting unit according to Embodiment 1 of the present invention.

FIGS. 4 and 5 are block diagrams of an oscillating apparatus according to the present invention in which each of the frequency varying units 3 and 6 is implemented with a PLL.

FIG. 4 is a circuit diagram of a second frequency varying unit and a second gradient setting unit in which each of the frequency varying units 3 and 6 is implemented with a PLL in which a frequency divider is included. The unit 3 (or 6) has a voltage controlled oscillator 40, a frequency divider 41, a multiplexer 42, a phase comparator 43 and a low-pass filter 44. The voltage controlled oscillator 40 generates an output signal having an oscillation frequency which can be controlled with an external voltage. As in the structure shown in FIG. 3, the output signal of the voltage controlled oscillator 40 is frequency-divided by the frequency divider 41 having eight stages, and one of the eight frequency division output signals of the frequency divider 41 is selected by the multiplexer 42, in accordance with a 3 bit address signal given from a latch circuit 45. The selected output signal of the frequency divider 41 is compared, in the phase comparator 43, with a signal fed from the voltage controlled crystal oscillator 20 or crystal oscillator 24 (FIG. 2), and a resulting comparison output from the phase comparator 43 is fed back through the low-pass filter 44 to the voltage controlled oscillator 40 as a control voltage.

The phase comparator 43 includes an exclusive OR circuit which produces a stationary output only when the frequencies of the two inputs thereto are equal to make the control loop stable. If this is the case, the frequency of the signal obtained by frequency-dividing by N the signal of the voltage controlled oscillator 40 is equal to the input signal, which means that the frequency of the signal of the voltage controlled oscillator 40 is exactly N times the frequency of the input signal to the frequency varying unit, where N represents an integer from 1 to 8.

A substitution of the structure shown in FIG. 4 for the frequency varying unit 3 of the oscillating apparatus shown in FIG. 2 provides the following results.

When the voltage controlled crystal oscillator 20 (FIG. 2) generates an output signal having a center frequency of 100 KHz and a variable frequency range of ±100 Hz and the multiplexer 42 selects the frequency division signal at the second stage, the output signal of the unit 3 has a center frequency of 400 KHz and a variable frequency range of ±400 Hz. Further, by setting a numerical value of 300000 for the cumulative adder 25 of the frequency varying unit 6 so that the output signal of the unit 6 has a frequency of 300 KHz, the oscillating apparatus provides an output signal having a center frequency of 100 KHz and a variable frequency range of ±100 Hz, which is a difference between the two output signals from the units 3 and 6.

FIG. 5 is a circuit diagram of a third frequency varying unit and a third gradient setting unit in which each of the frequency varying units 3 and 6 is implemented with a PLL waveform generator in which a cumulative adder is included.

The unit 3 (or 6) has a voltage controlled oscillator 50, a 16 bit cumulative adder 51, a phase comparator 52 and a low-pass filter 53. In this structure, the frequency divider 41 and the multiplexer 42 shown in FIG. 4 are replaced by the cumulative adder 51. The output signal from the voltage controlled oscillator 50 is fed to the cumulative adder 51 so that the adder 51 operates, with a 16 bit numerical value N to be cumulatively added, delivers from its MSB terminal a signal of a frequency equal to N/65536 times the frequency of the output signal of the oscillator 50. The operation for the PLL control is similar to that in FIG. 4, so that the frequency of the eventual output signal of the frequency varying unit 3 or 6 is 65536/N times as high as that of the input signal thereto.

A substitution of the structure shown in FIG. 5 for the frequency varying unit 3 of the oscillating apparatus shown in FIG. 2 provides the following functional results.

When the voltage controlled crystal oscillator 20 (FIG. 2) generates an output signal having a center frequency of 100

KHz and a variable frequency range of ±10 Hz and a numerical value of 4096 is set for the cumulative adder 51 to be cumulatively added, the output signal of the unit 3 has a center frequency of 1.6 MHz and a variable frequency range of ±160 Hz. Further, by setting a numerical value of 1500000 for the cumulative adder 25 of the frequency varying unit 6 so that the output signal of the unit 6 has a frequency of 1.5 MHz, the oscillating apparatus provides an output signal having a center frequency of 100 KHz and a variable frequency range of ±160 Hz, which is a difference between the two output signals from the units 3 and 6.

Figure 6:
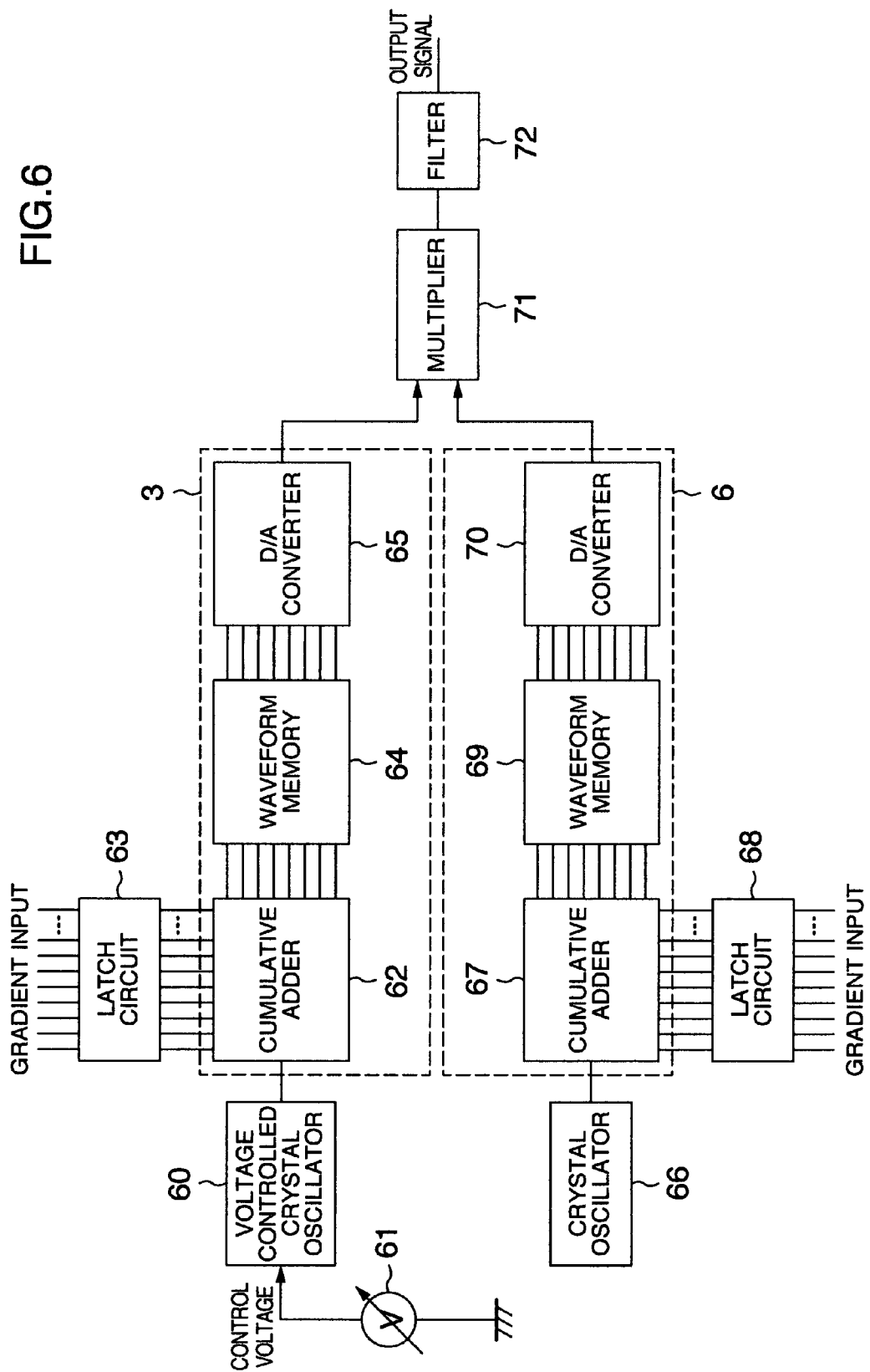
FIG. 6 is a second circuit diagram of an oscillating apparatus according to Embodiment 1 of the present invention.

FIG. 6 is a second circuit diagram of an oscillating apparatus in which each of the frequency varying units 3 and 6 is implemented with a DDS.

The voltage controlled oscillating unit 1 (FIG. 1) is constituted by a voltage controlled crystal oscillator 60 having a center frequency of 67.108864 MHz. When a control voltage from a variable voltage source 61 is varied through ±2 V from a center voltage of 2.5 V, the oscillation frequency of the oscillator 60 is changed through ±6710.8864 Hz from the center frequency of 67.108864 MHz.

A DDS with which the frequency varying unit 3 is implemented includes a 26 bit cumulative adder 62, a 8 bit/256 word waveform memory 64 and a 8 bit D/A converter 65. The cumulative adder 62 operates to cumulatively add a value, set in advance, for each period of the signal from the voltage controlled crystal oscillator 60 and delivers a resulting output signal. Among the 26 bit signals from the cumulative adder 62, the upper 8 bit signals are supplied as an address signal to the waveform memory 64. The waveform memory 64 stores numerical data for one period of a sinusoidal wave in the form of a 8 bit numerical value in which the sinusoidal wave is divided into 256 in terms of the phase. By setting the numerical value to be cumulatively added as a number in Hz representing a desired output frequency, the addressed data from the cumulative adder 62 provides a frequency determined by the set number. As a result, the waveform memory 64 provides a digital data of a sinusoidal wave having that frequency. The digital data output from the memory 64 is converted to an analog voltage signal by the D/A converter 65.

For example, if an output of 1 MHz is desired, a numerical value of 1000000 should be set. The numerical value to be set and cumulatively added may be given, for example, from a personal computer in the form of a 26 bit digital signal and is held in a latch circuit 63 so that the numerical value held in the circuit 63 is fed to the cumulative adder 62. Meanwhile, the oscillating unit 5 (FIG. 1) is constituted by a crystal oscillator 66 having an oscillation frequency of 67.108864 MHz. The frequency varying unit 6 is, like the frequency varying unit 3, implemented with a DDS including a 26 bit cumulative adder 67, a 8 bit/256 word waveform memory 69 and a 8 bit D/A converter 70. A latch circuit 68 is used to set a frequency for the unit 6.

The output signals from the frequency varying units 3 and 6 are supplied to a multiplier 71 for multiplication so that the multiplier 71 produces a signal of a waveform having a frequency of a sum of or a difference between the two supplied signals. The signal from the multiplier 71 is fed to a filter 72 which extracts an output signal of the frequency component of the sum or of the difference in a sinusoidal waveform.

In this embodiment, the filter 72 is constituted by a third order high-pass filter having a cutoff frequency of 2.5 MHz. By setting a numerical value of 2000000 for the cumulative adder 62 of the frequency varying unit 3 so that the unit 3 generates an output signal having a center frequency of 2 MHz and a variable frequency range of ±200 Hz, and a numerical value of 1000000 for the cumulative adder 67 of the frequency varying unit 6 so that the unit 6 generates an output signal of a frequency of 1 MHz, the oscillating apparatus provides an output signal of a frequency of 3 MHz±200 Hz which is a sum of the two output signals from the units 3 and 6. Meanwhile, by setting a numerical value of 500000 for the cumulative adder 62 so that the unit 3 generates an output signal having a center frequency of 500 KHz and a variable frequency range of ±50 Hz, and a numerical value of 2500000 for the cumulative adder 67 so that the unit 6 generates an output signal of a frequency of 2.5 MHz, the oscillating apparatus provides an output signal having a center frequency of 3 MHz and a variable frequency range of ±50 Hz, which is a sum of the two output signals from the units 3 and 6.

Embodiment 2

Figure 7:
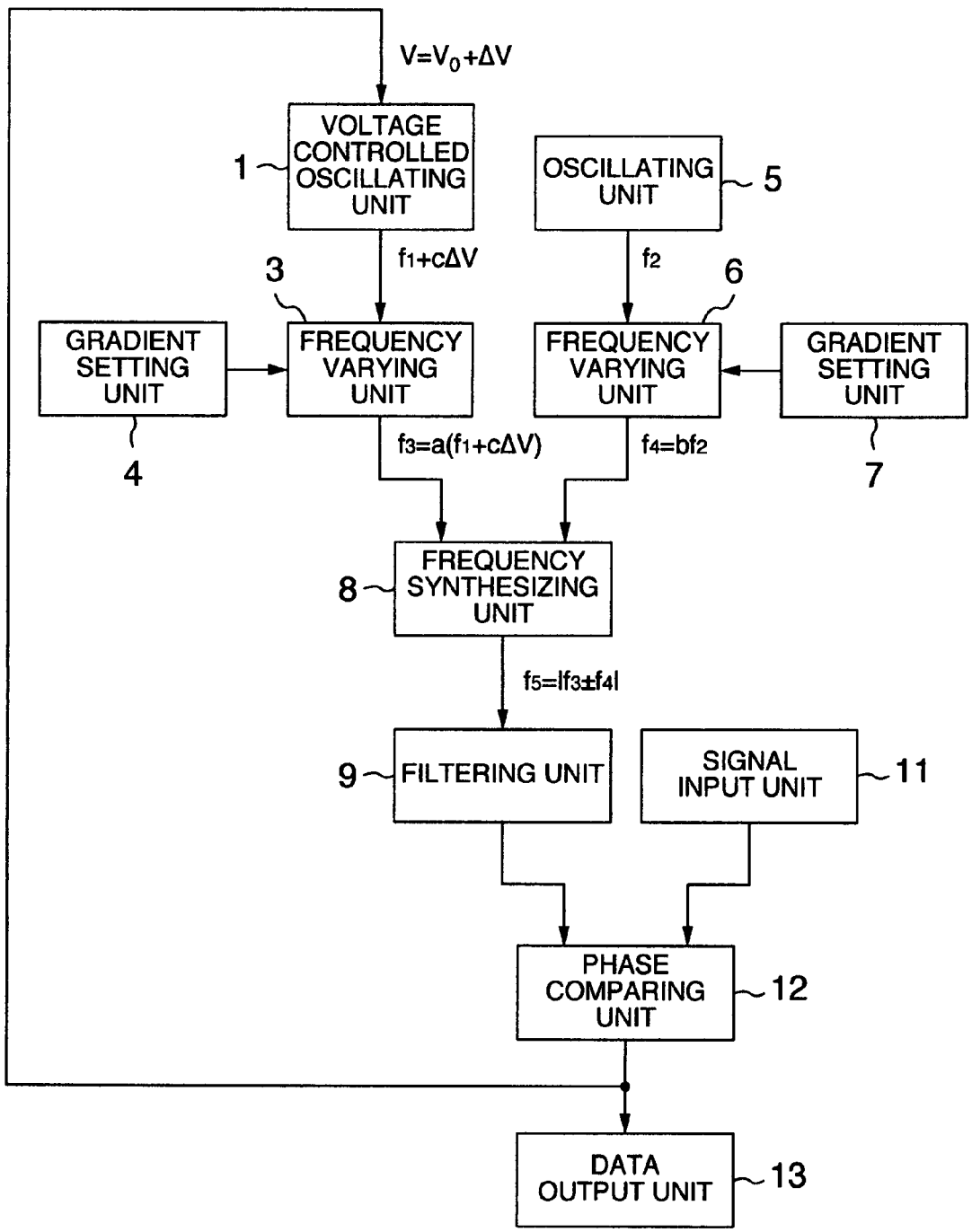
FIG. 7 is a block diagram of a frequency detecting apparatus according to Embodiment 2.

FIG. 7 shows an apparatus for detecting a frequency of a signal according to Embodiment 2 of the present invention.

A principle of operation of the frequency detecting apparatus will first be described with reference to FIG. 7.

A voltage controlled oscillating unit 1 oscillates at a frequency depending on a voltage V applied thereto from a control signal input unit 2 to supply an oscillation signal. With the voltage V ($V=V_0+\Delta V$) changing by $\Delta V$ with respect to a central value $V_0$, the oscillation signal of the voltage controlled oscillating unit 1 will change, with respect to a center frequency $f_1$, with a coefficient c for the voltage change $\Delta V$, so that the frequency of the signal from the unit 1 is represented by: $f_1+c \cdot \Delta V$. A frequency varying unit 3 varies the frequency of the oscillation signal supplied from the voltage controlled oscillating unit 1 at a rate a fed from a gradient setting unit 4, thereby delivering a signal of a frequency $f_3=a(f_1+c \cdot \Delta V)$.

Meanwhile, an oscillating unit 5 supplies an oscillation signal of a constant frequency $f_2$ to a frequency varying unit 6, which varies the frequency of the oscillation signal supplied from the oscillating unit 5 at a rate b fed from a gradient setting unit 7, thereby delivering a signal of a frequency $f_4=b \cdot f_2$. A frequency synthesizing unit 8 synthesizes the output signals of the frequency varying units 3 and 6 to generate a signal including frequency components $f_5=|f_3 \pm f_4|$ which are absolute values of a sum of and a difference between the frequencies of the output signals of the units 3 and 6. The comparative values for the frequencies $f_3$ and $f_4$ should be such that, for all of the values that the voltage V may assume, a relation $f_3 \geqq f_4$ or a relation $f_3 \leqq f_4$ should always stand. Namely, during variations of the frequency $f_3$ caused by variations of the voltage V, the comparative relation between the frequencies $f_4$ and $f_3$ should rest unchanged.

The signal from the frequency synthesizing unit 8 includes frequency components $f_3$ and $f_4$ which come from the outputs of the frequency varying units 3 and 6, respectively. These frequency components are removed by a filtering unit 9 so that a signal of only a frequency component $f_5$, which is a sum of or a difference between the frequencies $f_3$ and $f_4$, is extracted and is delivered through an output unit 10.

The ultimate output frequency $f_5$ will be:

$$f_5=(a \cdot f_1 \pm b \cdot f_2)+a \cdot c \cdot \Delta V, \text{ when } f_3 \geqq f_4$$

for all of the values that the voltage V may assume; and $$f_5=(b \cdot f_2 \pm a \cdot f_1)-a \cdot c \cdot \Delta V, \text{ when } f_3 \leqq f_4$$

for all of the values that the voltage V may assume.

Thus, the sense of the coefficient of variations in the frequency $f_5$ in response to variations $\Delta V$ in the case of $f_3 \geqq f_4$ is opposite to that in the case of $f_3 \leqq f_4$.

Namely, assuming that the coefficient c of variations in the frequency $f_5$ in response to variations $\Delta V$ in the oscillation signal from the voltage controlled oscillating unit 1 is positive, the frequency $f_5$ will be increased with coefficient (a·c) for $f_3 \geq f_4$, and will be decreased with coefficient (−a·c) for $f_3 \leq f_4$.

The output signal from the filtering unit 9 is, along with a signal to be measured from a signal input unit 11, fed to a phase comparing unit 12 for phase comparison. An output signal from the phase comparing unit 12 is delivered as a frequency data through a data output unit 13. A portion of the output signal from the phase comparing unit 12 is further fed back to the voltage controlled oscillating unit 1 as the frequency control voltage V.

By setting an appropriate value for the rate a by the gradient setting unit 4 to determine a variable frequency range of the frequency detecting apparatus in response to the control voltage V, and by adjusting the rate b to set by the gradient setting unit 7, a center frequency of the frequency detecting apparatus with respect to which the frequency of the apparatus is variable is established. By setting the center frequency of the apparatus around the frequency to be measured and by appropriately setting the variable frequency range depending on the accuracy in the frequency detection and a required frequency measurement range, it is possible to detect the frequency of a measured signal.

The voltage controlled oscillating unit 1 may be implemented with a voltage controlled oscillator (VCO), a voltage controlled crystal oscillator (VCXO), a voltage controlled ceramic oscillator, a voltage-frequency converter, or any other device that produces a voltage signal having a frequency variable in response to an input voltage signal. Particularly, use of a VCXO will provide good results.

The oscillating unit 5 may be implemented with any oscillator, and it is preferable that the oscillator should have a frequency stability as good as or better than that of the voltage controlled oscillating unit 1. Use of a crystal oscillator will provide good results.

The frequency varying units 3 and 6 may be, principally, implemented with a cumulative adder, a direct digital synthesizer (DDS), a frequency divider, a phase-locked loop (PLL) waveform generator, or any other device that generates an oscillation signal having a frequency variable in response to the frequency of an input signal thereto.

When use is made of a DDS or a cumulative adder, the output frequencies will be in a range of frequencies which are not higher than the frequency of an input signal, and the unit of variation in which the oscillation frequency is variable will be determined by the input signal frequency and the umber of bits of the cumulative adder, i.e., it will be (input signal frequency÷$2^N$), where N represents the number of bits of the cumulative adder. In this case, the gradient setting units 4 and 7 function to add, in the form of an N-bit digital signal, a numerical value A for each clock to the cumulative adders in the frequency varying units 3 and 6, respectively. The rate a of the frequency variation will be, for example, given by: a=A/$2^N$. Specifically, the gradient setting units 4 and 7 may have a circuit structure in which a digital signal from a computer is held in a latch circuit and an output of the latch circuit is supplied to a cumulative adder, or may have a circuit structure in which an on-off operation such as in a DIP switch is utilized to generate a digital signal.

When a frequency divider is used to implement the frequency varying units 3 and 6, the output frequencies will be in a range of frequencies which are not higher than the frequency of an input signal, and assuming that the frequency divider has N stages, it will be possible to establish the output frequency as (the input frequency/$2^n$), where n represents an integer not smaller than 1 and not larger than N.

An ultimate output signal from the unit 3 or 6 is delivered though a multiplexer serving to select one of the output signals which may be derived from the respective stages of the frequency divider. In that case, the gradient setting units 4 or 7 serves to apply to the multiplexer a numerical value n in the form of a digital signal which designates one of the output signals of the stages of the frequency divider to be selected. The rate a, for example, will be given by: a=1/$2^n$. Practical circuit structures similar to a DDS may be used.

When a PLL waveform generator is used to implement the frequency varying units 3 and 6, the output frequencies will be in a range of frequencies which are not lower than the frequency of an input signal, and assuming that the PLL includes an N-stage frequency divider, it will be possible to establish the output frequency as $2^n$ times the input frequency, where n represents an integer not smaller than 1 and not larger than N. In this case, the gradient setting units 4 and 7 may have a structure similar to that when each of the units 3 and 6 are implemented with a frequency divider. In either case, when the input signal is in a sinusoidal waveform, it may be converted to a rectangular waveform signal, if necessary.

The frequency synthesizing unit 8 may be implemented with a multiplier circuit, when the input signal thereto is in a sinusoidal waveform, and may be implemented with an EXOR circuit, an OR circuit, an AND circuit or any other circuit receiving two input signals and capable of producing, as a result of a logical operation, an output signal including a frequency component of a sum of or a difference between the frequencies of the two input signals, when the input signal to the unit 8 is in a rectangular waveform. When the input signal to the unit 8 is rectangular, use of an EXOR circuit for the unit 8 will provide good results. When the input signal is in a sinusoidal waveform, it may be converted to a rectangular waveform signal, if necessary.

The output signal from the frequency synthesizing unit 8 contains, in addition to the frequency components of a sum of and a difference between the two input signals thereto, the frequency components of the two input signals themselves. A filtering unit 9 is used in order to remove those frequency components which are other than the frequency components of a sum of and a difference between the two input signals. The unit 9 may be implemented with a band-pass filter having a passband of desired frequencies. A high-pass filter may also be used to implement the unit 9 when the output signal of the desired frequencies is a sum of the two input signals, while a low-pass filter may also be used to implement the unit 9 when the output signal of the desired frequencies is a difference between the two input signals and the desired frequencies are lower than the frequency of any one of the two input signals.

A signal input unit 11 includes a voltage follower circuit for increasing the input impedance as viewed by a signal to be measured, namely, as viewed from a to-be-measured signal side, if necessary, and further includes a capacitor for removing a dc component included in the to-be-measured signal and a comparator for converting the to-be-measured signal, when it is sinusoidal, to a rectangular wave signal. The phase comparing unit 12 may be constituted by an EXOR circuit, an OR circuit, an AND circuit or any other circuit that stably provides a logical output without fluctuation only when the frequencies of the input signals to the unit 12 are equal to each other. The best results are obtained when an EXOR circuit is used.

Since the output of this logical operation circuit includes the frequency component of the to-be-measured signal, it is necessary to provide a low-pass filter. Further, when the frequency of the output signal of the frequency varying unit 3 is lower than that of the output signal of the frequency varying unit 6, it will be necessary to reverse the direction of variations of the control voltage V to be applied to the voltage controlled oscillating unit 1. The data output unit 13 serves to generate a voltage V to be applied to the voltage controlled oscillating unit 1, the voltage being of a value corresponding to the frequency of the to-be-measured signal. Practically, the unit 13 may be constituted by a voltage follower for lowering the output impedance, but such voltage follower is dispensable.

An example of the frequency detecting apparatus will now be more specifically described.

The voltage controlled oscillating unit 1 is constituted by a voltage controlled crystal oscillator having a center frequency of 67.108864 MHz. When the control voltage signal thereto is changed through ±2 V from a center voltage of 2.5 V, the frequency of the output signal of the voltage controlled oscillator unit 1 is changed through ±6710.8864 Hz from its center frequency of 67.108864 MHz. The frequency varying unit 3 is implemented with a direct digital synthesizer including a 26 bit cumulative adder. It is possible to establish the frequency of the unit 3 by setting a number in Hz representing a desired output frequency as the numerical value to be cumulatively added in the cumulative adder.

The oscillating unit 5 is constituted by a crystal oscillator having an oscillation frequency of 67.108864 MHz, and the frequency varying unit 6 is implemented with a structure similar to that of the frequency varying unit 3. The frequency synthesizing unit 8 is constituted by an EXOR circuit which is a digital device. Since the outputs from the units 3 and 6 have a sinusoidal waveform, the unit 8 is provided with an input stage including a wave-shaping circuit for conversion of the sinusoidal output signals from the units 3 and 6 to signals of a rectangular waveform. The filtering unit 9 is constituted by a third order low-pass filter having a cutoff frequency of 150 KHz.

The phase comparing unit 12 is constituted by an EXOR circuit. Since the output signal from the filtering unit 9 and the to-be-measured signal inputted from the signal input unit 11 are in a sinusoidal waveform, the unit 12 is provided with an input stage including a wave-shaping circuit for conversion of the sinusoidal signals rectangular signals.

The described frequency detecting apparatus is set such that the apparatus has a range of detection frequencies of ±100 Hz from a center frequency of 100 KHz. To this end, a numerical value of 10000000 is set for the cumulative adder of the frequency varying unit 3 so that the unit 3 generates an output signal having a center frequency of 10 MHz and a variable frequency range of ±1 KHz, and a numerical value of 900000 is set for the cumulative adder of the frequency varying unit 6 so that the unit 6 generates an output signal of a frequency of 9.9 MHz.

The output signals of the varying frequency units 3 and 6 are fed to the frequency synthesizing unit 8 the output of which is then fed to the filtering unit 9 so that the unit 9 provides a signal having a center frequency of 100 KHz and a variable frequency range of ±1 KHz. A signal to be measured or a to-be-measured signal from the signal input unit 11 is compared with the signal from the unit 9 at the phase comparing unit 12 the comparison output of which is fed back to voltage controlled oscillating unit 1 to carry out a feedback such that the frequencies of the to-be-measured signal and of the output signal of the filtering unit 9 are equal to each other. When they are equal to each other, the output signal from the phase comparing unit 12 indicates the frequency of the to-be-measured signal.

Embodiment 3

A non-contact inter-atomic force microscope using the frequency detecting apparatus in FIG. 7 will be described.

In this embodiment, a cantilever with a probe attached to its free end is made to vibrate. The cantilever has a characteristic vibration frequency of 250 KHz. With the probe on the vibrating cantilever placed neat to a surface of a specimen, variations in the vibration frequency of the cantilever brought about by the inter-atomic force generated between them is detected by the frequency detecting apparatus. By scanning the surface of the specimen with the variations in the vibration frequency of the cantilever kept unchanged, unevenness or roughness of the surface of the specimen is measured.

The frequency detecting apparatus used in the microscope according to this embodiment will now be described. In FIG. 7, the voltage controlled oscillating unit 1 is constituted by a voltage controlled crystal oscillator having a center frequency of 67.108864 MHz. When the control voltage signal thereto is changed through ±2 V from a center voltage of 2.5 V, the frequency of the output signal of the voltage controlled oscillator unit 1 is changed through ±6710.8864 Hz from its center frequency of 67.108864 MHz.

The frequency varying unit 3 is implemented with a direct digital synthesizer including a 26 bit cumulative adder. It is possible to establish the frequency of the unit 3 by setting a number in Hz representing a desired output frequency as the numerical value to be cumulatively added in the cumulative adder. By setting a numerical value of 1000000 is for the cumulative adder of the unit 3, the unit 3 generates an output signal having a center frequency of 1 MHz and a variable frequency range of ±100 Hz.

The oscillating unit 5 is constituted by a crystal oscillator having an oscillation frequency of 3.0 MHz, and the frequency varying unit 6 is implemented with a frequency divider having a frequency division rate of ¼ so that the unit 6 provides a signal of a frequency of 750 KHz.

The frequency synthesizing unit 8 is constituted by an EXOR circuit which is a digital device. Since the output of the frequency varying unit 3 is sinusoidal, it is first converted to a rectangular wave signal by a wave-shaping circuit and is then subjected to a frequency synthesis at the frequency synthesizing unit 21 to thereby obtain from the unit 12 an output signal having a center frequency of 250 KHz and a variable frequency range of ±100 Hz, which is a difference between the two output signals from the units 3 and 6.

The filtering unit 9 is constituted by a third order pi (π) low-pass filter having a cutoff frequency of 300 KHz. The displacement signal for the cantilever, detecting reflected light beams of a laser radiation emitted to an upper surface of the cantilever by a photo detector having two detecting elements is inputted in the form of a voltage signal from the signal input unit 11. The phase comparing unit 12 is constituted by an EXOR circuit. Since the output signal from the filtering unit 9 and cantilever vibration signal from the signal input unit 11 are sinusoidal, the unit 12 is provided with an input stage including a wave-shaping circuit for conversion of the sinusoidal signals to rectangular signals for phase comparison.

By feeding the output voltage signal from the phase comparing unit 12 back to voltage controlled oscillating unit 1, a feedback is effected such that the frequencies of the two signals supplied to the unit 12 are equal to each other. When they are equal, the output signal from the phase comparing unit 12 indicates the frequency of the cantilever vibration.

By manipulating a distance between the probe and the specimen surface, and by scanning the specimen surface with the probe with the variation in the vibration frequency of the cantilever kept at an optional constant value between −5 to −50 Hz, it is possible to clearly observe the shapes in the unevenness or roughness of the specimen surface.

Further, by setting a numerical value of 62500 is for the cumulative adder so that the frequency varying unit 3 generates an output signal having a center frequency of 6.25 KHz and a variable frequency range of ±6.25 Hz, and by setting 1/16 for the frequency division rate of the frequency divider of the frequency varying unit 6 so that the unit 6 provides a signal of a frequency of 187.5 KHz, use of a sum of the frequencies of the output signals of the frequency varying units 3 and 6, that is, use of the signal having a center frequency of 250 KHz and having a variable frequency range of ±6.25 Hz will make it possible to keep the variation in the vibration frequency of the cantilever at an optional value between −0.5 to 5 Hz.

The described embodiments show oscillating apparatus which can establish a center frequency and a variable frequency range with a high stability and a high accuracy and are well applicable to various fields of industries to advantage.

It should be further understood by those skilled in the art that although the foregoing description has been on embodiments of the invention, the invention is not limited thereto and various change and modifications may be made without departing from the spirit of the invention and the scope of the appended claims.

The invention claimed is:

1. An oscillating apparatus comprising:
a first oscillator for generating a first oscillation signal, said first oscillation signal having a first frequency of ($f_1$ + $c \cdot \Delta V$) in which the first frequency is variable through $\Delta f$ with respect to a center frequency of $f_1$ in response to a supplied voltage;
a second oscillator for generating a second oscillation signal having a second frequency of $f_2$;
a first frequency varying unit for generating a third oscillation signal having a frequency of $f_3$, the frequency of said third oscillation signal being a times as large as that ($f_1 + c \cdot \Delta V$) of the first oscillation signal;
a second frequency varying unit for generating a fourth oscillation signal having a frequency of $f_4$, the frequency of said fourth oscillation signal being b times as large as that ($f_2$) of the second oscillation signal;
a frequency synthesizing unit for synthesizing said third and fourth oscillation signals to generate a fifth oscillation signal, said fifth oscillation signal including a frequency component of $f_5$ of an absolute value of a sum of or a difference between said third and fourth oscillation signals ($f_5 = |f_3 \pm f_4|$); and
a filtering unit for removing frequency components of said $f_3$ and $f_4$ from said fifth oscillation signal wherein at least one of said first and second frequency varying units includes a cumulative adder, a direct digital synthesizer or a phase-locked loop (PLL) waveform generator.

2. An oscillating apparatus according to claim 1, wherein a variable frequency range is established by setting a predetermined value for said a, and a center frequency of an output of said filtering unit is established by setting predetermined values for said a and b.

3. An oscillating apparatus according to claim 1, wherein said first oscillator includes a voltage controlled crystal oscillator or a voltage controlled ceramic oscillator, and said second oscillator includes a crystal oscillator or a ceramic oscillator.

4. An oscillating apparatus comprising:
a first oscillator for generating a first oscillation signal, said first oscillation signal having a first frequency of ($f_1$ + $c \cdot \Delta V$) in which the first frequency is variable through $\Delta f$ with respect to a center frequency of $f_1$ in response to an external voltage;
a second oscillator for generating a second oscillation signal having a frequency of $f_2$;
a first frequency varying unit for generating a third oscillation signal having a frequency of $f_3$, the frequency $f_3$ ($f_3 = a \cdot (f_1 + \Delta f)$) of said third oscillation signal being a times as large as that of the first oscillation signal, where a represents a constant;
a second frequency varying unit for generating a fourth oscillation signal having a frequency of $f_4$, the frequency $f_4$ ($f_4 = b \cdot f_2$) of said fourth oscillation signal being b times as large as that of the second oscillation signal, where b represents a constant;
a frequency synthesizing unit for generating a fifth oscillation signal, said fifth oscillation signal including a signal of a frequency identical with a sum ($f_3 + f_4$) of the frequencies of said third and fourth oscillation signals and/or a signal of a frequency identical with an absolute value ($|f_3 - f_4|$) of a difference between said third and fourth oscillation signals; and
a filtering unit for selecting one of said signal of the frequency identical with said sum ($f_3 + f_4$) and said signal of the frequency identical with said absolute value of the difference ($|f_3 - f_4|$) to thereby generate a sixth oscillation signal,
wherein: said constant a with which said first frequency varying unit is operative serves to specify a variable frequency range ($a \cdot \Delta f$) of said sixth signal, said variable frequency range depending on said external voltage; and said constant a with which said first frequency varying unit is operative and said constant b with which said second frequency varying unit is operative serve to specify a center frequency ($|a \cdot f_1 \pm b \cdot f_2|$) of said sixth signal wherein at least one of said first and second frequency varying units includes a cumulative adder, a direct digital synthesizer or a phase-locked loop waveform generator.

5. An oscillating apparatus according to claim 4, wherein said first oscillator includes a voltage controlled crystal oscillator or a voltage controlled ceramic oscillator, and said second oscillator includes a crystal oscillator or a ceramic oscillator.

6. An frequency detecting apparatus comprising:
a first oscillator for generating a first oscillation signal, said first oscillation signal having a first frequency of ($f_1$ + $c \cdot \Delta V$) in which the first frequency is variable through $\Delta f$ with respect to a center frequency of $f_1$ in response to an external voltage;
a second oscillator for generating a second oscillation signal having a frequency of $f_2$;
a first frequency varying unit for generating a third oscillation signal having a frequency of $f_3$, the frequency $f_3$ of said third oscillation signal being a times as large as that ($f_1 + c \cdot \Delta V$) of the first oscillation signal;
a second frequency varying unit for generating a fourth oscillation signal having a frequency of $f_4$, the frequency $f_4$ of said fourth oscillation signal being b times as large as that ($f_2$) of the second oscillation signal;
a frequency synthesizing unit for synthesizing said third and fourth oscillation signals to generate a fifth oscillation signal, said fifth oscillation signal including frequency components ($f_5 = |f_3 \pm f_4|$) of a sum of the frequencies of said third and fourth oscillation signals and of an absolute value of a difference between said third and fourth oscillation signals;

a filtering unit for removing a frequency component of said $f_3$ and a frequency component of said $f_4$ from said fifth oscillation signal; and a phase comparing unit for comparing a phase of an output of said filtering unit and a phase of a signal to be measured, wherein a voltage generated from said phase comparing unit is fed as said external voltage to said first oscillator and represents a frequency of said signal to be measured wherein at least one of said first and second frequency varying units includes a cumulative adder, a direct digital synthesizer or a phase-locked loop waveform generator.

7. An frequency detecting apparatus according to claim 6, wherein said first oscillator includes a voltage controlled crystal oscillator or a voltage controlled ceramic oscillator, and said second oscillator includes a crystal oscillator or a ceramic oscillator.

* * * * *